US 8,201,995 B2

(12) United States Patent
McCarthy et al.

(10) Patent No.: US 8,201,995 B2
(45) Date of Patent: Jun. 19, 2012

(54) METHOD AND SYSTEM FOR A TEMPERATURE SENSING CRYSTAL INTEGRATED CIRCUIT WITH DIGITAL TEMPERATURE OUTPUT

(75) Inventors: Evan McCarthy, Costa Mesa, CA (US); John Walley, Ladera Ranch, CA (US); Todd L Brooks, Laguna Beach, CA (US); Vinay Chandrasekhar, Irvine, CA (US); Josephus Van Engelen, Aliso Viejo, CA (US); Jared Welz, Seal Beach, CA (US)

(73) Assignee: Broadcom Corporation, Irvine, CA (US)

( * ) Notice: Subject to any disclaimer, the term of this patent is extended or adjusted under 35 U.S.C. 154(b) by 707 days.

(21) Appl. No.: 12/364,064

(22) Filed: Feb. 2, 2009

(65) Prior Publication Data

US 2009/0196322 A1 Aug. 6, 2009

Related U.S. Application Data

(60) Provisional application No. 61/025,724, filed on Feb. 1, 2008, provisional application No. 61/088,893, filed on Aug. 14, 2008.

(51) Int. Cl.
*H03L 1/00* (2006.01)
(52) U.S. Cl. .......................... 374/117; 374/170; 331/176
(58) Field of Classification Search .................. 374/117, 374/170; 331/176
See application file for complete search history.

(56) References Cited

U.S. PATENT DOCUMENTS

| 5,025,231 | A | * | 6/1991 | Schwartzbach | ........... 331/116 R |
| 5,185,610 | A | | 2/1993 | Ward et al. | |
| 5,204,975 | A | * | 4/1993 | Shigemori | ..................... 455/231 |
| 5,473,289 | A | * | 12/1995 | Ishizaki et al. | ................ 331/176 |
| 5,594,453 | A | | 1/1997 | Rodal et al. | |
| 5,654,718 | A | | 8/1997 | Beason | |
| 5,760,656 | A | * | 6/1998 | Sutliff et al. | ............. 331/116 R |
| 5,883,550 | A | * | 3/1999 | Watanabe et al. | ............. 331/176 |
| RE36,973 | E | * | 11/2000 | Shigemori | ..................... 455/231 |
| 6,160,458 | A | | 12/2000 | Cole | |
| 6,249,155 | B1 | * | 6/2001 | Hartman et al. | ............... 327/106 |
| 6,414,559 | B1 | * | 7/2002 | Cole et al. | ...................... 331/158 |
| 6,603,364 | B2 | * | 8/2003 | Nemoto | .......................... 331/66 |

(Continued)

OTHER PUBLICATIONS

Rakon Limited, New Zealand Provisional Specification entitled Frequency Reference Device and/or a Method of Providing a Temperature Compensated Frequency, Application Patent No. 264490, dated Sep. 20, 1994, pp. 1-23.

(Continued)

*Primary Examiner* — Christopher Fulton
(74) *Attorney, Agent, or Firm* — Thomas, Kayden, Horstemeyer & Risley LLP.

(57) ABSTRACT

Aspects of a method and system for a temperature sensing crystal Integrated circuit with digital temperature output are provided. In this regard, an indication of temperature may be generated in an integrated circuit (IC) comprising a memory, a crystal or crystal oscillator, and at least a portion of an analog-to-digital converter. The temperature indication may be digitized via the analog-to-digital converter. Operation of one or more circuits may be controlled based on the digital temperature indication. The digital temperature indication may be communicated over a communication bus. An analog portion of the analog-to-digital converter may be integrated in the IC and may comprise, for example, a delta-sigma modulator. A digital portion of the analog-to-digital converter may be external to the IC and may comprise, for example, a digital filter.

21 Claims, 5 Drawing Sheets

U.S. PATENT DOCUMENTS 7,371,005 B1     5/2008  Ahuja
7,482,889 B2 *   1/2009  Stolpman ...................... 331/176
7,728,685 B2 *   6/2010  Nakamura et al. ............ 331/176
7,768,360 B2 *   8/2010  Sutardja ........................ 331/176

OTHER PUBLICATIONS

Schodowski, Blair, An External Compensated Crystal Oscillator Study, Northern Illinois University article, 1986, pp. 169-178.

* cited by examiner

US 8,201,995 B2

METHOD AND SYSTEM FOR A TEMPERATURE SENSING CRYSTAL INTEGRATED CIRCUIT WITH DIGITAL TEMPERATURE OUTPUT

CROSS-REFERENCE TO RELATED APPLICATIONS/INCORPORATION BY REFERENCE

This patent application makes reference to, claims priority to and claims benefit from:

U.S. Provisional Patent Application Ser. No. 61/025,724 filed on Feb. 1, 2008; and U.S. Provisional Patent Application Ser. No. 61/088,893 filed on Aug. 14, 2008.

This patent application also makes reference to:

U.S. patent application Ser. No. 12/364,046 entitled "Method and System for Signal Generation via a Temperature Sensing Crystal Integrated Circuit" filed on even date herewith;

U.S. patent application Ser. No. 12/364,117 entitled "Method and System for Compensating Temperature Readings from a Temperature Sensing Crystal Integrated Circuit" filed on even date herewith; and U.S. patent application Ser. No. 12/364,095 entitled "Method and System for an Energy Efficient Temperature Sensing Crystal Integrated Circuit" filed on even date herewith.

Each of the above stated applications is hereby incorporated herein by reference in its entirety.

FIELD OF THE INVENTION

Certain embodiments of the invention relate to signal processing. More specifically, certain embodiments of the invention relate to a method and system for a temperature sensing crystal Integrated circuit with digital temperature output.

BACKGROUND OF THE INVENTION

A crystal oscillator is an electronic circuit that uses mechanical resonance of a vibrating crystal of piezoelectric material to create an electrical signal with a relatively precise frequency. This frequency is commonly used as a reference or clock signal for a variety of circuits. The vibration of the crystal may vary with temperature and/or over time. Such variations in the resonant frequency of the crystal may create instabilities or other lead to other problems in an electronic system.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for a temperature sensing crystal integrated circuit with digital temperature output, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a temperature sensing crystal integrated circuit with digital temperature output. In various embodiments of the invention, an indication of temperature may be generated in an integrated circuit (IC) comprising a memory, a crystal or crystal oscillator, and at least a portion of an analog-to-digital converter. The temperature indication may be digitized via the analog-to-digital converter. Operation of one or more circuits may be controlled based on the digitized indication of temperature. The digital temperature indication may be output via one or more terminals of the IC. The digital temperature indication may be communicated over a communication bus which, in some instances, may utilize a clock generated by, or based on, a frequency generated via a crystal or crystal oscillator within the TSCIC 158. An analog portion of the analog-to-digital converter may be integrated in the IC. The analog portion of the analog-to-digital converter may comprise, for example, a delta-sigma modulator. A digital portion of the analog-to-digital converter may be external to the IC. The digital portion of the analog-to-digital converter may comprise, for example, a digital filter. A band gap voltage may be generated within the IC. The band gap voltage may be digitzed via the analog-to-digital converter.

Figure 1:
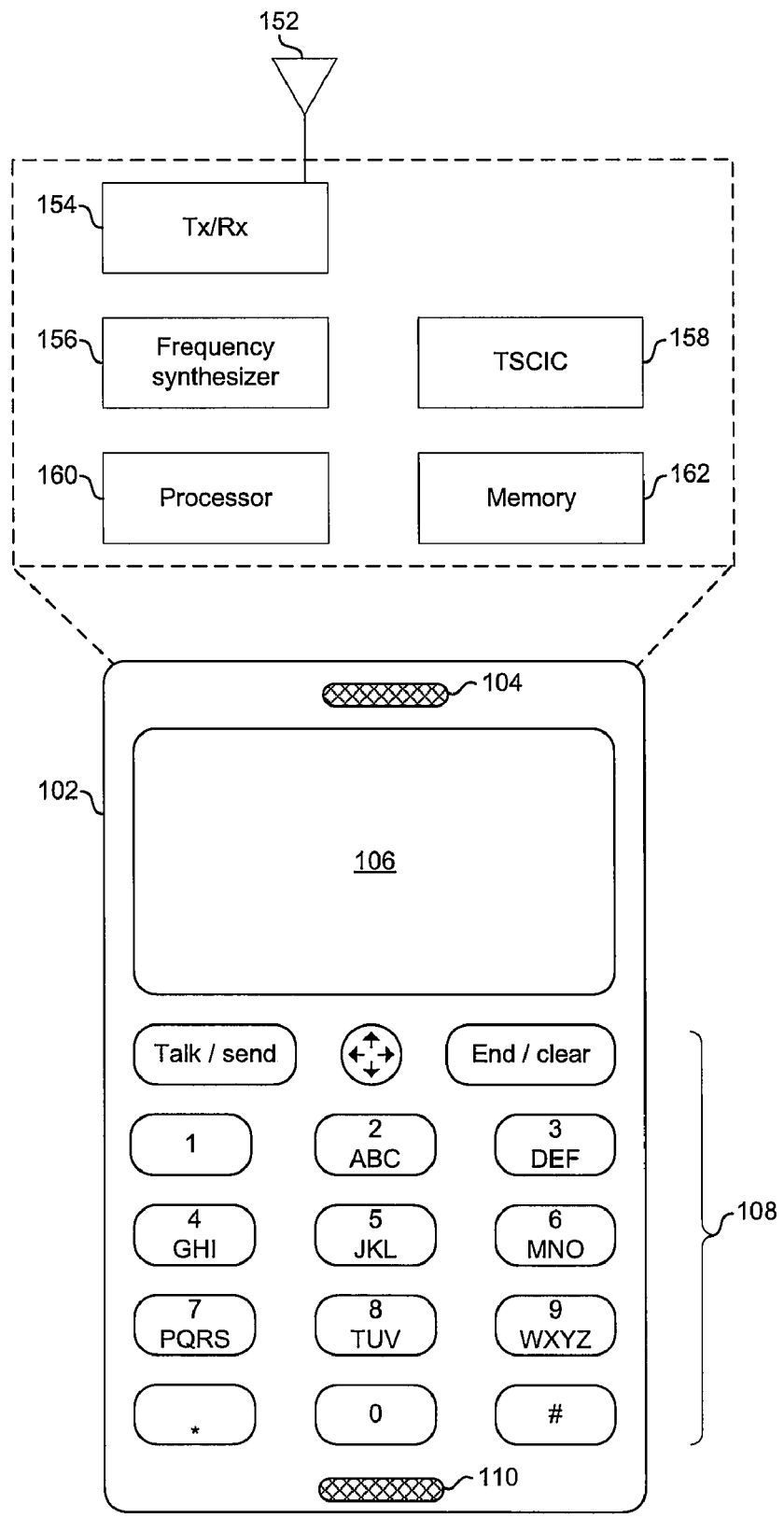
FIG. 1 illustrates an exemplary communication device comprising a temperature sensing crystal integrated circuit (TSCIC), in accordance with an embodiment of the invention.

FIG. 1 illustrates an exemplary communication device comprising a temperature sensing crystal integrated circuit (TSCIC), in accordance with an embodiment of the invention. Although a communication device is used for illustration, a TSCIC may be utilized in any type of electronic device. In one exemplary embodiment of the invention, the TSCIC may be utilized in a GPS system to enable fast(er) acquisition of GPS signals. The communication device 102 may comprise an antenna 152, a transmitter and/or receiver module (Tx/Rx) 154, a processor 160, a memory 162, an analog to digital converter (ADC) 164, a display 106, user controls 108, a speaker 104, and a microphone 110.

The antenna 152 may be suitable for transmitting and/or receiving wireless signals. Although a single antenna is illustrated, the invention is not so limited. In this regard, the Tx/Rx 154 may utilize a common antenna for transmission and reception, may utilize different antennas for transmission and reception, and/or may utilize a plurality of antennas for transmission and/or reception.

The temperature sensing crystal integrated circuit (TSCIC) 158 may comprise a crystal and suitable logic, circuitry, and/or code that may be operable to generate one or more oscillating signals. Additionally, the TSCIC 158 may provide one or more digital signals and data that may enable determination of a frequency of the generated oscillating signals over time and/or temperature variations. Block diagrams of exemplary TSCICs are described below with respect to FIGS. 2A and 2B. In some embodiments of the invention, the TSCIC 158 may be coupled to one or more external components to realize a crystal oscillator circuit. In other embodiments of the invention, the TSCIC 158 may comprise one or more active and/or passive components coupled to a crystal to realize a crystal oscillator circuit. In such embodiments, the TSCIC 158 may generate an oscillating signal without external components.

The frequency synthesizer 156 may comprise suitable logic, circuitry, and/or code that may be operable to generate one or more oscillating signals. In some embodiments of the invention, the frequency synthesizer 156 may comprise active and/or passive components which may be coupled to xtal+ and xtal− terminals of the TSCIC 158 to realize a crystal oscillator circuit. In some embodiments of the invention, the frequency synthesizer may comprise, for example, an integer-N PLL, fractional-N PLL, and/or a direct digital frequency synthesizer (DDFS). An output of the crystal oscillator circuit may be coupled to and provide a reference frequency to the PLL and/or DDFS.

In the exemplary embodiment of the invention depicted in FIG. 1, the frequency synthesizer 156 is shown as a separate block, however, the invention is not so limited. In various embodiments of the invention a portion, or all, of the frequency synthesizer 156 may be integrated into the TSCIC 158 and/or a portion, or all, of the frequency synthesizer 156 may be integrated into the Tx/Rx 154.

The Tx/Rx 154 may comprise suitable logic, circuitry, interfaces, and/or code that may be operable to transmit and/or receive signals utilizing a variety of wireless protocols. Exemplary communication wireless protocols utilized by the communication device 102 may comprise various cellular protocols, WiMAX, Bluetooth, Wi-Fi, DVB-H/S/T, GNSS, broadcast radio, and broadcast television. The Tx/Rx 154 may be operable to perform amplification, down-conversion, filtering, demodulation, and analog to digital conversion of received signals. The Tx/Rx 154 may be operable to perform amplification, up-conversion, filtering, modulation, and digital to analog conversion of signals to be transmitted. In various embodiments of the invention, the Tx/Rx 154 may utilize one or more reference frequencies from the frequency synthesizer 156 and/or the TSCIC 158.

The processor 160 may comprise suitable logic, circuitry, interfaces, and/or code that may enable processing data and/or controlling operations of the communication device 102. The processor 160 may be enabled to provide and receive control signals to and from the various other portions of the communication device 102. The processor 160 may control transfers of data between various portions of the communication device 102. In this regard, the processor 160 may control reads and writes to memories and/or control registers in the communication device 102. Additionally, the processor 160 may enable execution of applications programs and/or code. The applications, programs, and/or code may enable, for example, processing of data, configuring portions of the communication device 102, and/or controlling operation of the communication device 102. For example, the processor 160 may comprise a plurality of registers and an arithmetic and logic unit (ALU) for performing mathematic and logical manipulations of data and/or control signals.

The memory 162 may comprise suitable logic, circuitry, and/or code that may enable storage or programming of information comprising parameters and/or code that may effectuate the operation of the communication device 102. Stored information may comprise received data and/or data to be presented, transmitted, and/or otherwise processed. For example, one or more received portions of one or more datastreams may be buffered in the memory 162. The parameters may comprise configuration data and the code may comprise operational code such as software and/or firmware, but the information need not be limited in this regard. In various embodiments of the invention, the memory 162 may store data characterizing behavior of the TSCIC 158.

The display 106 may comprise suitable logic, circuitry, interfaces and/or code that may be operable to provide visual information to, and/or enable interaction by, a user of the communication device 102. In various embodiments of the invention, a graphical user interface may be presented via the display 106. The user interface of the mobile communication device 102 may be utilized to select which source or sources it may have a desire to receive content from. A frequency and/or wireless standard to be utilized for communication may be selected based on user input. Accordingly, based on such user input, the frequency synthesizer 156 and/or the Tx/Rx 154 may be adjusted and/or configured. In various embodiments of the invention, a visual media content such as video, images, and text may be presented via the display 106.

The user controls 108 may be operable to enable user interaction with the communication device 102 to control services and/or content handled by the communication device 102. The user controls 108 may comprise, for example, a keypad, a keyboard, a roller ball, a multidirectional button, a scroll wheels, and/or a touch screen.

The speaker 104 may be operable to present audio information to a user. The speaker may present voice from a phone call and/or music or ringtones played back by the communication device.

The microphone 110 may be operable to convert acoustic signals into electronic signals. The microphone may enable a user to participate in a phone call and/or interact with the communication device via oral input.

In operation, the TSCIC 158 may internally generate a voltage or current that has a known, or estimable, relationship to temperature. The voltage or current may be digitized to generate a digital temperature indication that may be output via a terminal of the TSCIC 158. The digital temperature indication may comprise a plurality of bits, which may be output in parallel or serially. In various embodiments of the invention, the TSCIC 158 may output an N-bit value as a serial stream of N bits or as N bits in parallel. In other embodiments of the invention, the TSCIC 158 may output a bit stream generated by, for example, a delta-sigma modulator. In the latter case, the bit stream may be filtered by the processor 160 to determine an average voltage of the bit stream which may correspond to temperature in the TSCIC 158. The processor 160 may utilize the digital temperature indication to retrieve data from a data table characterizing the behavior of the TSCIC 158 over temperature. The data characterizing the behavior of the TSCIC 158 may be utilized to configure, for example, the Tx/Rx 154 and/or the frequency synthesizer 156 to compensate for frequency variations over temperature.

Figure 2A:
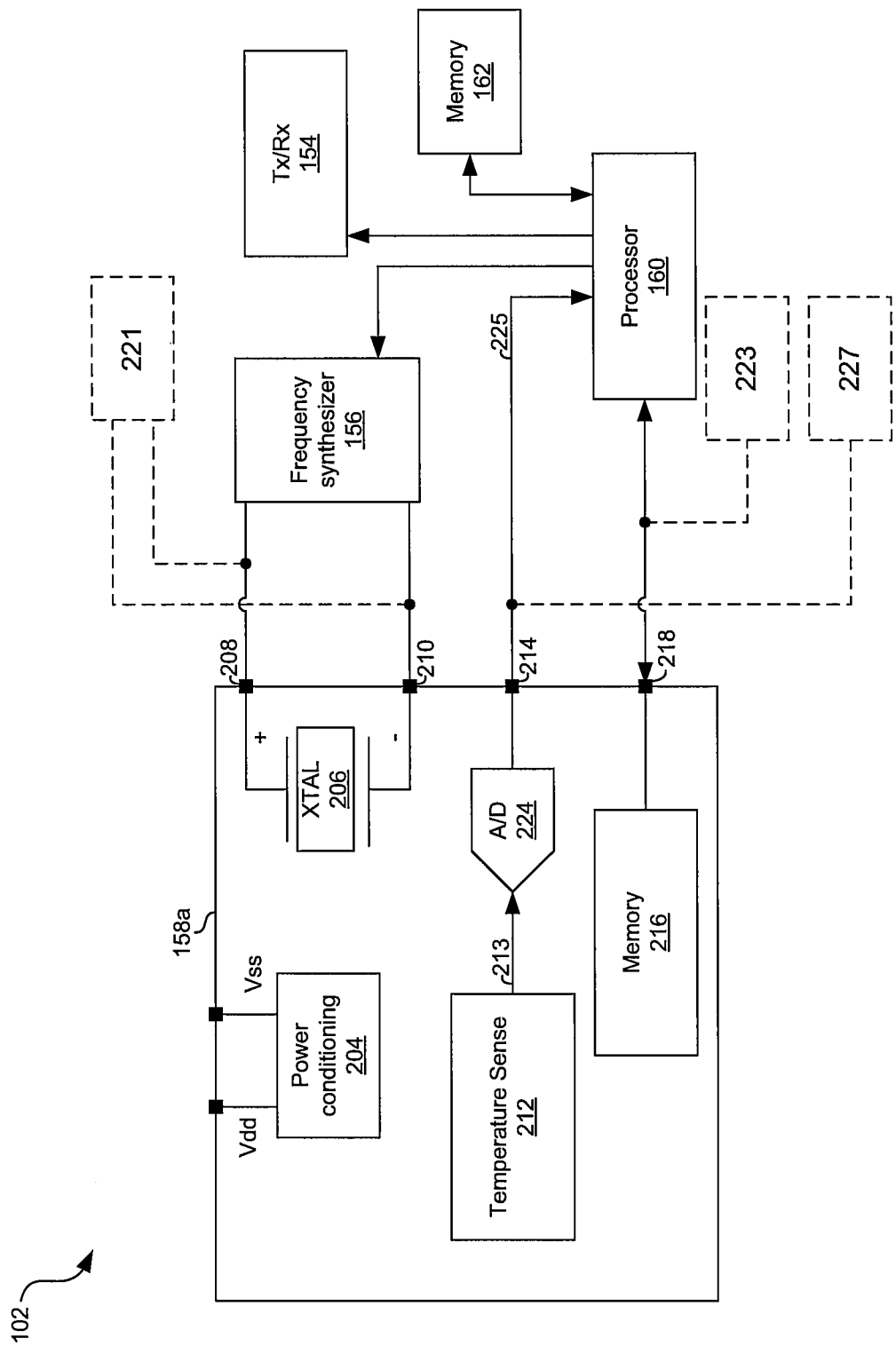
FIG. 2A is a block diagram illustrating an exemplary TSCIC, in accordance with an embodiment of the invention.

FIG. 2A is a block diagram illustrating an exemplary TSCIC, in accordance with an embodiment of the invention. Referring to FIG. 2A, there is shown TSCIC 158a and exemplary coupling between the various devices of the system 102. The TSCIC 158a may be an exemplary embodiment of the TSCIC 158 of FIG. 1. In an exemplary embodiment of the invention, the frequency synthesizer 156, the processor 160, and the memory 162 may be integrated into a system on chip (SoC). The TSCIC 158a comprises a power conditioning block 204, a crystal 206, a memory 216, and an analog to digital converter (ADC) 224. Additionally, in some embodiments of the invention, the TSCIC 158a may comprise a power conditioning block 204.

The frequency synthesizer 156, the processor 160, the memory 162, and the Tx/Rx 154 may be as described with respect to FIG. 1.

The ADC 224 may comprise suitable logic, circuitry, and/or code that may enable conversion of analog signals to a digital representation. In this regard, the ADC 224 may sample and quantize, at times specified by a sample clock, an analog temperature indication signal 213 to generate a digital temperature indication 225. The digital temperature indication may comprise a plurality of bits, which may be conveyed serially or in parallel. In some embodiments of the invention, the digital temperature indication may be the output of a delta-sigma modulator. Digitized temperature indications may be communicated to devices external to the TSCIC 154a via the terminal 214. Additionally, one or more devices, such as other processors, represented generically as device 227, may be coupled to the terminal 214 instead of, or in addition to, the processor 160.

The power conditioning block 204 may comprise suitable logic, circuitry, interfaces, and/or code that may be operable to generate one or more regulated voltages and/or currents from a supply voltage Vdd-Vss. In various embodiments of the invention, the power conditioning block 204 may be operable to implement a power-on-reset to ensure the TSCIC 158a powers up and/or initializes properly. In an exemplary embodiment of the invention, the voltage Vdd may be +1.8V and Vss may be 0V or GND. The power conditioning block 204 may be operable to reduce, increase, limit, filter, or otherwise condition the supply voltage to generate power rails for powering the temperature sensing module 212, the memory 216, and the ADC 224. Notwithstanding, in various embodiments of the invention the TSCIC 158a may function reliably and/or sufficiently from an external power supply and may not comprise a power conditioning block 204.

The crystal 206 may comprise a piezoelectric material. A resonant frequency of the crystal 206 may be utilized to provide a reference frequency for an electronic circuit. The resonant frequency of the crystal 206 may depend on the material, the size, and the shape of the material, and may also depend on the temperature of the crystal. Accordingly, aspects of the invention may be operable to provide compensation for the temperature dependence of the resonant frequency of the crystal 206. Devices external to the TSCIC 158a may be coupled to the crystal 206 via the terminals 208 and 210. In this regard, one or more devices such as other processors or frequency synthesizers, represented generically as device 221, may be coupled to the terminals 208 and 210 instead of, or in addition to, the frequency synthesizer 156.

The memory 216 may comprise suitable logic, circuitry, interfaces, and/or code operable to store data. In various embodiments of the invention, the memory 216 may be non-volatile memory such as flash or fuse based memory or an EEPROM. In various embodiments of the invention, the memory 216 may be read only or may be writable. In this regard, one or more flags in the memory 216 may indicate whether the memory 216 is writable and/or whether contents of the memory 216 have been modified. In this manner, data, which may be compressed utilizing known or proprietary algorithms, may be stored in the memory 216 during production of the TSCIC 158a and may be remain valid during and subsequent to installation of the TSCIC 158a into a device such as the communication device 102 of FIG. 1. Data and/or control signals may be communicated between the memory 216 and the processor 160 via the terminal 218. The memory 216 may store one or more data tables, such as the data tables described below with respect to FIG. 3, which may characterize the behavior of the TSCIC 158a over temperature. In this regard, the data tables may be indexed based on digital temperature indications measured and/or recorded at the terminal 214. Additionally, one or more devices such as other processors and/or controllers, represented generically as device 223, may be coupled to the terminal 218 instead of, or in addition to, the processor 160.

The temperature sensing module 212 may comprise suitable logic, circuitry, and/or code that may be operable to generate a signal 213 which may be a current or voltage indicative of a temperature of the crystal 206. In an exemplary embodiment of the invention, the signal 213 may be a voltage that ranges from 0V to 1V over a temperature range of −30° C. to +75° C. Notwithstanding, the invention is not so limited and other voltage ranges and/or temperature ranges may be utilized without departing from the various embodiments of the invention.

In operation, the temperature sensing module 212 may generate a signal 213, which may be a voltage or current, that has a known, or estimable, relationship to temperature of, or near, the crystal 206. The ADC 224 may digitize the signal 213 output by the digital temperature indication as signal 225 via the terminal 214. The digital temperature indication 225 may comprise a plurality of bits, output in parallel or serially. For example, the TSCIC 158a may output an N-bit value as a serial stream of N bits or as N bits in parallel. The processor 160 may receive the digitized temperature indication and then utilize it, or a table index generated based on it, to retrieve data from the memory 162 and/or the memory 216. The processor 160 may configure one or both of the Tx/Rx 154 and the frequency synthesizer 156 based on the retrieved data.

Figure 2B:
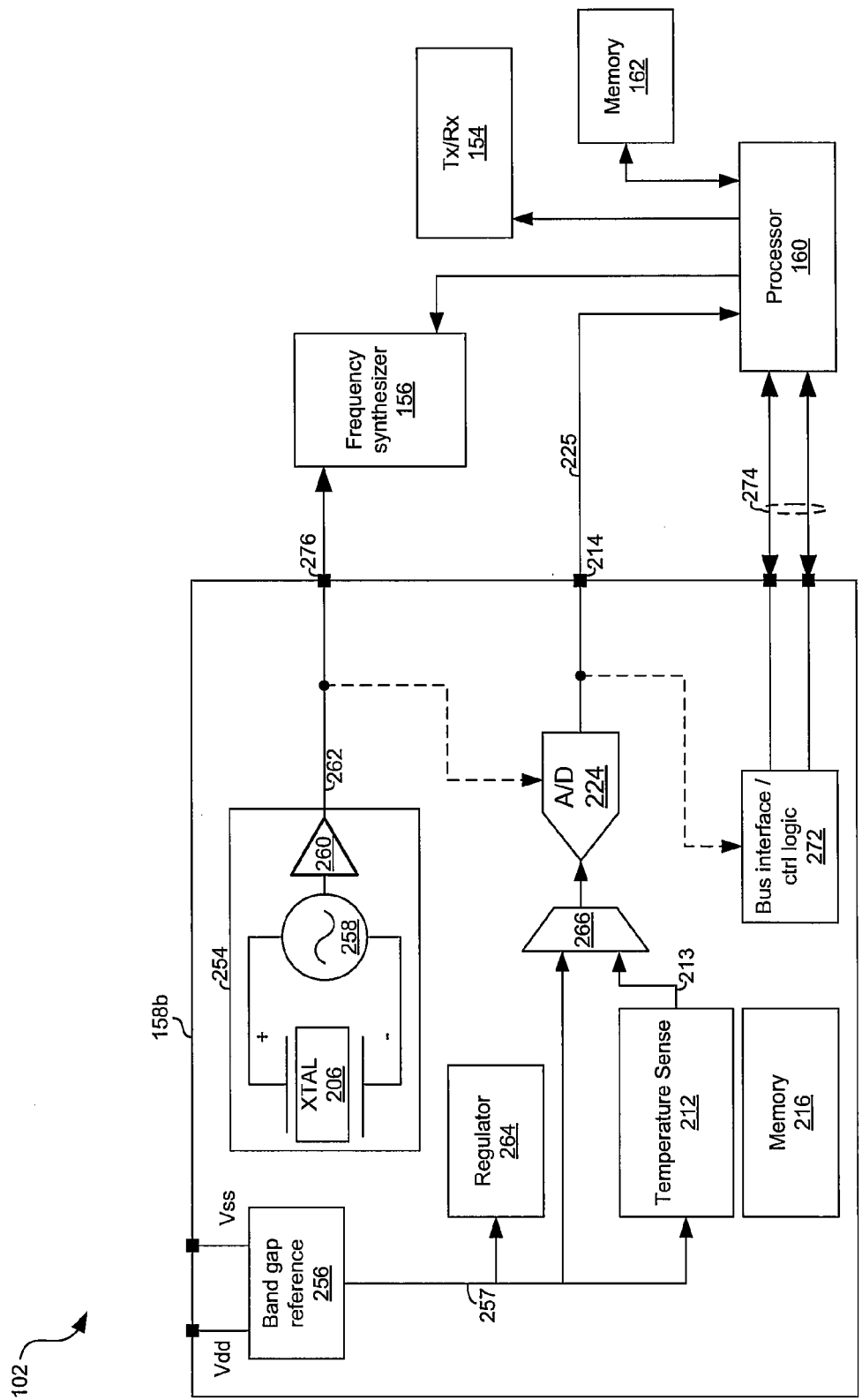
FIG. 2B is a block diagram illustrating another exemplary TSCIC, in accordance with an embodiment of the invention.

FIG. 2B is a block diagram illustrating another exemplary TSCIC, in accordance with an embodiment of the invention. Referring to FIG. 2B, there is shown TSCIC 158b and exemplary coupling between the various devices of the system 102. The TSCIC 158b may be an exemplary embodiment of the TSCIC 158 of FIG. 1. The TSCIC 158b comprises band gap reference 256, regulator 264, crystal oscillator 254, switching element 266, buffer 268, temperature sensing module 212, memory 216, communication and control module 272, and ADC 224.

The communication and control module 272 may comprise suitable logic, circuitry, interfaces, and/or code operable to communicate with external devices via the communication bus 274 and to control and/or configure the various components of the TSCIC 158b. The communication and control module 272 may comprise one or more registers for configuring the TSCIC 158b and/or indicating attributes of the TSCIC 158b. The communication and control module 272 may be operable to receive one or more signals from the various other components of the TSCIC 158b. The communication and control module 272 may be operable to receive signals via the communication bus 274. The communication and control module 272 may be operable to generate one or more signals to control and/or configure other components of the TSCIC 158b. In this regard, control signals generated may be in response to signals received from the other components of the TSCIC 158b and/or via the communication bus 274.

The communication bus 274 may comprise one or more of a GND, a data signal, a power signal, and a clock signal. The communication bus may be synchronous or asynchronous and data may be communicated serially or in parallel. A clock for the communication bus 274 may be generated by, or based on a signal 262 generated by the crystal oscillator 254. The communication bus 275 may be, for example, an inter-integrated circuit (I²C) bus, a system management bus (SMBus), a 1-Wire bus, a serial peripheral interconnect (SPI) bus, or may be a proprietary communication bus.

The communication and control module 272 may be operable to transmit signals to other devices via the communication bus 274. In this regard, control signals generated may be in response to signals received from the other components of the TSCIC 158b and/or via the bus 274. For example, the communication and control module 272 may be operable to write and/or read to and/or from the memory 216 based on commands received via the communication bus 274. In this regard, the communication and control module 272 may write data received via the bus 274 to the memory 216 and may communicate data read from the memory 216 over the communication bus 274.

The frequency synthesizer 156, the processor 160, the memory 162, and the Tx/Rx 154 may be as described with respect to FIG. 1. The temperature sensing module 212 and the memory 216 may be substantially as described with respect to FIG. 2A.

The band gap reference 256 may be operable to output a reference voltage approximately equal to the theoretical band gap of the material of which the TSCIC 158b is fabricated. For example, for silicon the band gap reference voltage 257 may be approximately 1.25V. The band gap reference 257 may be provided to the temperature sensing module 212 such that the signal 213 generated by the temperature sensing module 212 may be highly accurate and stable over a range of temperatures and over time. In one exemplary embodiment of the invention, the band gap reference 256 may be a sub-module of the power conditioning module 204 described with respect to FIG. 2A.

The regulator 264 may comprise suitable logic, circuitry, and/or code to regulate one or more voltages and/or currents supplied to the crystal oscillator 254, the temperature sensing module 212, the memory 216, the switching element 266, the buffer 268, the communication and control module 272, and/or the ADC 224. In this regard, the regulator 264 be a linear or switching regulator and may filter, boost, buck, enable and disable, or otherwise condition the power in the TSCIC 158b. In one exemplary embodiment of the invention, the regulator 264 may be a sub-module of the power conditioning module 204 described with respect to FIG. 2A.

The crystal oscillator 254 may comprise an oscillator circuit 258 coupled to the crystal 206 and buffered by the buffer 260. The crystal 254 may be coupled as a load of the oscillator circuit 258 which may comprise one or more active and/or passive components.

The switching element 266 may comprise suitable logic, circuitry, and/or code operable to route either the band gap reference 257 or the signal 213 to the ADC 224. The switching element 266 may be controlled via one or more signals from the communication and control module 272. In an exemplary embodiment of the invention, the switching element 266 may comprise a multiplexer.

In operation, the communication and control module 272 may receive a command to output a temperature reading via the terminal 214. Accordingly, the switching element 266 may be configured to route the signal 213 to the ADC 224 which may digitize the signal 213 to generate the digital temperature indication 225. In some embodiments of the invention, the digital temperature indication 224 may be output via a terminal 214. In some embodiments of the invention, the digital temperature indication 225 may be communicated over the communication bus 274. The processor 160 may receive the digital temperature indication 225 and reference either the memory 162 or the memory 272 to determine the frequency of, and/or a frequency correction value for, the crystal oscillator 245 at the indicated temperature. The processor 160 may then reconfigure, and/or adjust one or more control signals to, the frequency synthesizer 156 and/or the Tx/Rx 158 based on the determined frequency and/or frequency correction value.

Upon power up, the crystal oscillator 254 may begin generating an oscillating signal $F_{ref}$. The frequency synthesizer 156 may receive the oscillating signal 262, of frequency $F_{ref}$, via the terminal 276. In some embodiments of the invention, the signal 262 generated by the crystal oscillator 254 may be utilized as a sampling clock of the ADC 224 or may be utilized to generate a sampling clock of the ADC 224. In some embodiments of the invention, the signal 262 may be a reference signal for one or more PLLs within the frequency synthesizer 156. In this regard, the one or more PLLs may generate one or more signals having an integer or fractional multiple of $F_{ref}$. In some embodiments of the invention, a DDFS in the frequency synthesizer 156 may be clocked by signal 262. In some embodiments of the invention, the signal 262 may be divided down by a frequency synthesizer to generate one or more signals that are lower in frequency.

Figure 2C:
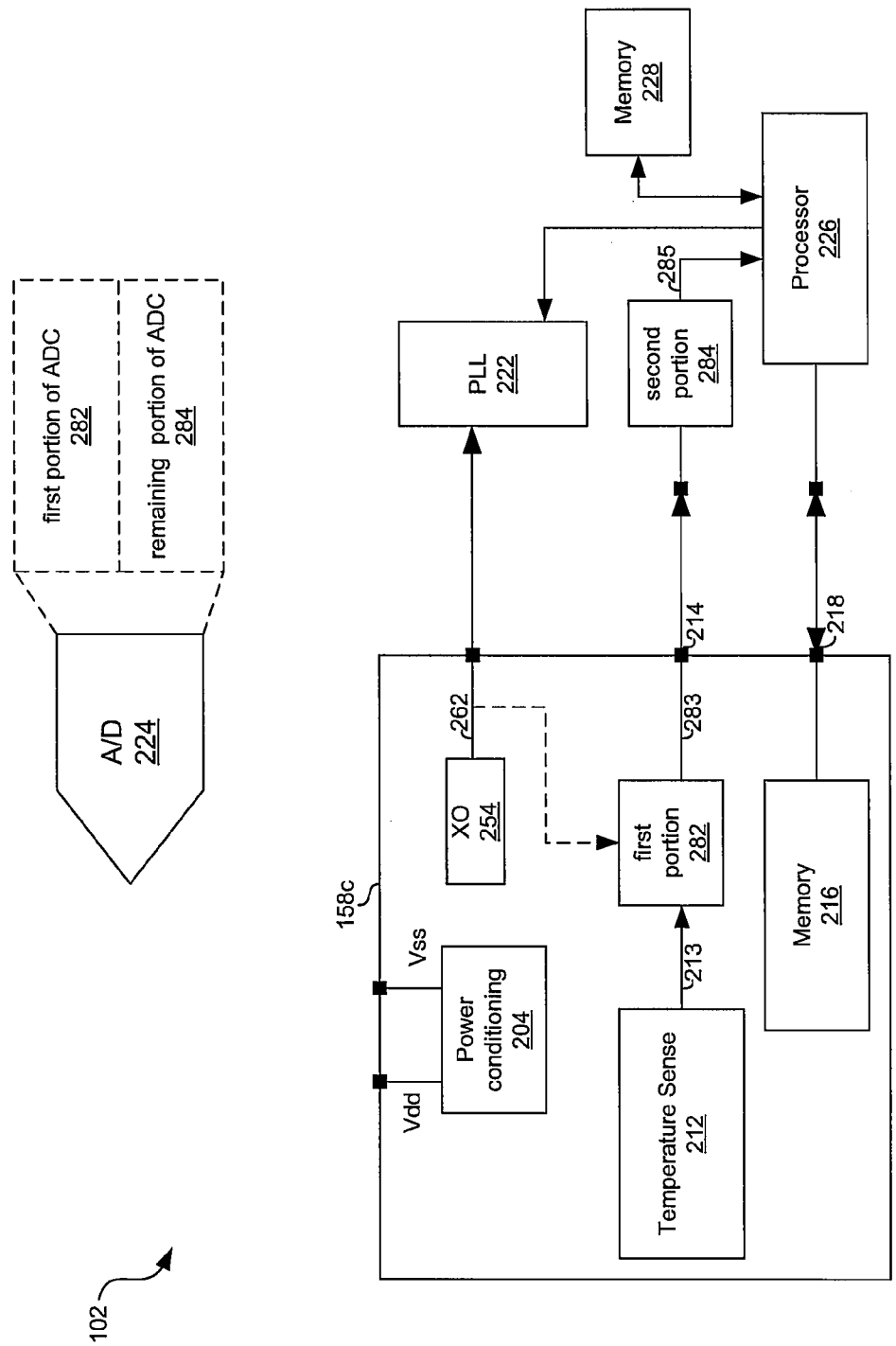
FIG. 2C is a block diagram illustrating another exemplary TSCIC, in accordance with an embodiment of the invention.

FIG. 2C is a block diagram illustrating another exemplary TSCIC, in accordance with an embodiment of the invention. Referring to FIG. 2C, the TSCIC 158c may be similar to the TSCIC 158a shown in FIG. 2A, with the difference being that, in the TSCIC 158c, a first portion 282 of the ADC 224 is in the TSCIC 158c and a remaining portion 284 of the ADC 224 is external to the TSCIC 158c.

In an exemplary embodiment of the invention, the first portion 282 may comprise analog components of the ADC 224 and the remaining portion 284 may comprise digital components of the ADC 224. For example, the first portion 282 may comprise a delta-sigma modulator and the remaining portion 284 may comprise a digital filter. In this regard, the remaining portion 284 may be realized or implemented in the processor 160.

In operation, the temperature sensing module 212 may generate a signal 213 which may be an analog voltage or current that represents the temperature of, or near, the crystal 206. In an exemplary embodiment of the invention, the first portion 282 of the ADC 224 may generate a signal 283 which may toggle between Vdd and Vss, or between Idd and Iss for a current mode device. The width or frequency of the pulses of the signal 283 may be such that the average voltage or current of the signal 283 may correspond to the average voltage or current of the signal 213. Accordingly, the second portion 284 of the ADC 224 may digitally filter the signal 283 to generate the digital temperature indication 285 corresponding to the average voltage or current of the signal 283. The processor 160 may utilize the digital temperature indication 285 to configure portions of the system 102.

In various embodiments of the invention, the first portion 282 may be clocked by the signal 262 output by the crystal oscillator 254 or by a signal generated from signal 262.

Figure 3:
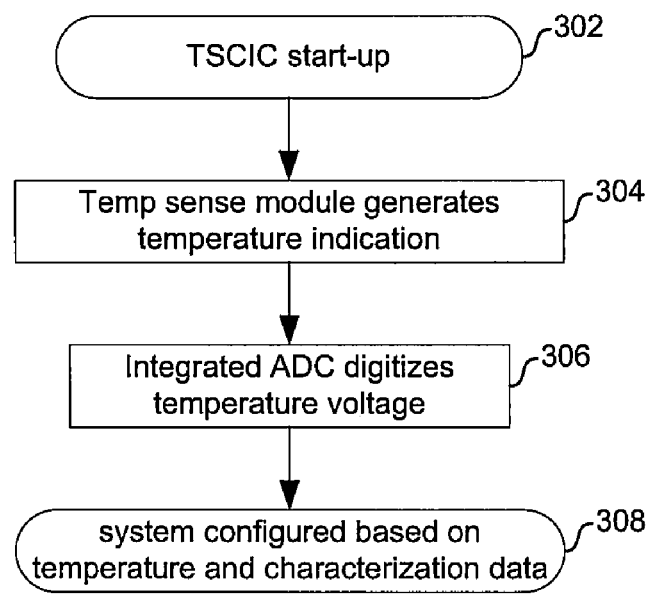
FIG. 3 is a flow chart illustrating exemplary steps for compensating for variations over temperature utilizing a TSCIC, in accordance with an embodiment of the invention.

FIG. 3 is a flow chart illustrating exemplary steps for compensating for variations over temperature utilizing a TSCIC, in accordance with an embodiment of the invention. Referring to FIG. 3, the exemplary steps may begin with step 302 in which a system comprising a TSCIC may be powered up and may undergo a power-on-reset. Subsequent to step 302, the exemplary steps may advance to step 304. In step 304, a temperature sensing module in the TSCIC may begin generating a temperature indication. In various embodiments of the invention, the temperature sensing module may generate an analog voltage or current. Subsequent to step 304, the exemplary steps may advance to step 306. In step 306, an analog-to-digital converter, or portion thereof, integrated within the TSCIC may digitize the analog signal from the temperature sensing module and output a digital temperature indication. Subsequent to step 308, the exemplary steps may advance to step 310. In step 310, one or more components of the system may be configured based on the digital temperature indication and based on data stored in the TSCIC.

Various aspects of a method and system for a temperature sensing crystal Integrated circuit with digital temperature output are provided. In an exemplary embodiment of the invention, a temperature indication 213 may be generated in an integrated circuit (IC) 158 comprising a memory 216, a crystal 206 or crystal oscillator 254, and at least a portion of an analog-to-digital converter 224. The temperature indication 213 may be digitized via the analog-to-digital converter 224. Operation of one or more circuits, such as the Tx/Rx 154 and the frequency synthesizer 156, may be controlled based on the digital temperature indication 225. The digital temperature indication 225 may be output via one or more terminals 214 of the IC. The digital temperature indication 225 may be communicated over a communication bus 274 which may, in some instances, utilize a clock generated by, or based on, a frequency generated via a crystal or crystal oscillator within the TSCIC 158. An analog portion 282 of the analog-to-digital converter 224 may be integrated in the TSCIC 158. The analog portion 282 of the analog-to-digital converter 224 may comprise, for example, a delta-sigma modulator. A digital portion 284 of the analog-to-digital converter 224 may be external to the TSCIC 158. The digital portion 284 of the analog-to-digital converter 224 may comprise, for example, a digital filter. A band gap voltage 257 may be generated within the IC 158. The band gap voltage 257 may be digitized via the analog-to-digital converter 224.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a temperature sensing crystal Integrated circuit with digital temperature output.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
    generating an indication of temperature in a temperature sensing crystal integrated circuit (TSCIC);
    digitizing said generated indication of temperature via an analog-to-digital converter, wherein at least a portion of said analog-to-digital converter is integrated within said TSCIC; and
    responsive to a retrieval request from a processor and based on said digitized indication, outputting TSCIC data characterizing performance of the TSCIC for controlling operation of one or more circuits.

2. The method according to claim 1 comprising outputting said digitized indication of temperature via one or more terminals of said TSCIC.

3. The method according to claim 1, wherein an analog portion of said analog-to-digital converter is integrated within said TSCIC.

4. The method according to claim 3, wherein said analog portion of said analog-to-digital converter comprises a delta-sigma modulator.

5. The method according to claim 1, wherein a digital portion of said analog-to-digital converter is external to said TSCIC.

6. The method according to claim 5, wherein said digital portion of said analog-to-digital converter comprises a digital filter.

7. The method according to claim 1, comprising outputting said digitized indication of temperature via a communication bus.

8. The method according to claim 7, wherein a clock for said communication bus is generated based on a frequency output by a crystal or crystal oscillator within said TSCIC.

9. The method according to claim 7, wherein a clock for said communication bus is generated based on a frequency output by a crystal or crystal oscillator within said TSCIC.

10. The method according to claim 1 comprising generating a band gap reference voltage in said TSCIC.

11. The method according to claim 10 comprising digitizing said band gap reference voltage via said analog-to-digital converter.

12. A system for signal processing, the system comprising:
    one or more first circuits in an integrated circuit, said one or more first circuits comprises a memory, a crystal or crystal oscillator, and at least a portion of an analog-to-digital converter, wherein said one or more first circuits are operable to:
    generate an indication of temperature;
    digitize said indication of temperature; and wherein operation of one or more other second circuits is controlled based on said digitized indication of temperature; and
    responsive to a retrieval request from a processor and based on the digitized temperature indication, output data characterizing performance of the integrated circuit for controlling operation of said one or more other second circuits.

13. The system according to claim 12, wherein said one or more first circuits is operable to output said digitized indication of temperature via one or more terminals.

14. The system according to claim 12, wherein an analog portion of said analog-to-digital converter is integrated within said integrated circuit.

15. The system according to claim 14, wherein said analog portion of said analog-to-digital converter comprises a delta-sigma modulator.

16. The system according to claim 12, wherein a digital portion of said analog-to-digital converter is external to said TSCIC.

17. The system according to claim 16, wherein said digital portion of said analog-to-digital converter comprises a digital filter.

18. The system according to claim 12, wherein said one or more first circuits is operable to output said digitized indication of temperature via a communication bus.

19. The system according to claim 12, wherein said one or more first circuits is operable to generate a band gap reference voltage in said integrated circuit.

20. The system according to claim 19, wherein said one or more first circuits is operable to digitize said band gap reference voltage via said analog-to-digital converter.

21. A method, comprising:
generating, by an integrated circuit, a digitized indication of temperature;
outputting, by the integrated circuit, the digitized temperature indication to a processor; and
responsive to a retrieval request from the processor, outputting, by the integrated circuit, data characterizing performance of the integrated circuit, wherein the data is utilized by the processor for controlling operation of one or more of: a frequency synthesizer circuit and a transmitter/receiver circuit, and wherein the retrieval request is sent by the processor based on the digitized temperature indication.

* * * * *